(12) United States Patent
Sugiura

(10) Patent No.: US 7,088,186 B2
(45) Date of Patent: Aug. 8, 2006

(54) HIGH-FREQUENCY POWER AMPLIFIER MODULE

(75) Inventor: Masayuki Sugiura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/060,548

(22) Filed: Feb. 18, 2005

(65) Prior Publication Data
US 2005/0174874 A1    Aug. 11, 2005

Related U.S. Application Data

(63) Continuation of application No. PCT/JP03/07355, filed on Jun. 10, 2003.

(51) Int. Cl.
H03F 3/14    (2006.01)

(52) U.S. Cl. ........................ 330/307; 330/302; 330/310

(58) Field of Classification Search ................. 330/66, 330/68, 150, 302, 310; 333/247; 257/664, 257/691, 692, 728
See application file for complete search history.

(56) References Cited

U.S. PATENT DOCUMENTS

| 6,172,567 B1 * | 1/2001 | Ueno et al. .................. 330/133 |
| 6,249,186 B1 * | 6/2001 | Ebihara et al. ............. 330/310 |

FOREIGN PATENT DOCUMENTS

| EP | 1061577 A2 | 12/2000 |
| JP | 03-278701 | 12/1991 |
| JP | 10-197662 | 7/1998 |
| JP | 2000-357771 | 12/2000 |
| JP | 2002-141756 | 5/2002 |

* cited by examiner

Primary Examiner—Khanh Van Nguyen
(74) Attorney, Agent, or Firm—Oblon, Spivak, McClelland, Maier & Neustadt, P.C.

(57) ABSTRACT

A ground layer is provided between a first and a second wiring layer. A first transistor provided at the first wiring layer amplifies a supplied high-frequency signal. A second transistor provided at the first wiring layer amplifies the output signal of the first transistor. A first power supply line, which supplies power to the first transistor, is provided at the first wiring layer. A second power supply line, which supplies power to the second transistor, is provided at the second wiring layer.

20 Claims, 5 Drawing Sheets

US 7,088,186 B2

HIGH-FREQUENCY POWER AMPLIFIER MODULE

CROSS-REFERENCE TO RELATED APPLICATIONS

This is a Continuation Application of PCT Application No. PCT/JP03/07355, filed Jun. 10, 2003, which was published under PCT Article 21(2) in English.

BACKGROUND OF THE INVENTION

1. Field of the Invention

This invention relates to a high-frequency power amplifier, and more particularly to a miniature high-frequency power amplifier module, for amplifying high-frequency power in, for example, a mobile phone or a portable terminal.

2. Description of the Related Art

With the demands for the miniaturization of terminals and longer calls, a high-frequency power amplifier at the last stage of the signal transmitting section of a portable terminal is required to be smaller and have higher efficiency. In recent years, the demand for miniaturization has been particularly getting stronger. To meet the demand, power amplifiers have been modularized in such a manner that transistors and peripheral parts constituting an amplifier are squeezed into a small package, with the input and output impedances matched to 50 Ω. The size of the module is 4 to 5 mm square.

One of the performance characteristics the module is required to have is an easy-to-use feature. Specifically, the module is required to have its input and output matched with specific impedances and be excellent in surge resistance, temperature characteristic, and stability to voltage fluctuations. Furthermore, the module is needed to be stable to fluctuations in an external circuit. Specifically, a power amplifier is provided near the exterior, via a passive component, such as a switch or a duplexer. For this reason, the amplifier is required not to malfunction, such as break down or oscillate, when there are expected fluctuations in the external situation, such as load fluctuations, for example, the damage to the antenna or the deformation of the antenna.

One typical example of such a malfunction is $f_0/2$ oscillation. This occurs at half of the transmission frequency $f_0$, when the load is changed greatly in a state where a transmission signal of a frequency of $f_0$ is being inputted. Several causes of the oscillation are considered. Hereinafter, one of the causes will be explained.

FIG. 1 schematically shows a circuit of a two-stage amplifier constituting a power amplifier module. The power amplifier module comprises a GaAs chip 11 acting as an amplifier section, an input matching circuit 12, an output matching circuit 13, current supply lines (power supply lines) ML1, ML2 having, for example, inductance components L1, L2, and capacitors C1, C2 composed of chip parts. The GaAs chip 11, which is composed of a heterojunction bipolar transistors (HBT), comprises a transistor Q1 which constitutes a first-stage amplifier, a transistor Q2 which constitutes a second-stage amplifier an MIM (Metal Insulator Metal) capacitor C3, and a bias circuit 14.

The input matching circuit 12 is connected between an input pin $P_{in}$ and the base of the transistor Q1. The output matching circuit 13 is connected between the collector of the transistor Q2 and an output pin $P_{out}$. The line ML1 having the inductance component L1 is connected between a power pin $V_{cc1}$ and the collector of the transistor Q1. The line ML2 having the inductance component L2 is connected between a power pin $V_{cc2}$ and the collector of the transistor Q2. The capacitor C1 is connected between the power pin $V_{cc1}$ and the ground and the capacitor C2 is connected between the power pin $V_{cc2}$ and the ground. A load $Z_{out}$ is connected between the output pin $P_{out}$ and the ground.

The load impedance of the transistor Q2 is originally designed to operate in a linear or slightly saturated region. However, for example, when an antenna (not shown) connected to the power amplifier module has broken, the value of the load $Z_{out}$ fluctuates seriously. The fluctuation in the load $Z_{out}$ causes the load impedance of the transistor to take a different value from the designed value. Under this condition, if a signal is outputted at the output pin $P_{out}$, reflected waves will be generated at the load $Z_{out}$, which can cause a large current to flow or a great voltage amplitude to occur in the transistor Q2. As a result, the transistor Q2 operates nonlinearly, resulting in a distorted waveform. At this time, the transistors Q2 operate in an equivalent manner to a so-called mixer and therefore have a frequency conversion gain.

As shown in FIG. 1, when there is a circuit constituting a feedback loop LP1 in the power amplifier module, the conversion gain the transistors Q1, Q2 have can permit the loop gain to exceed "1" for a signal of a frequency of $f_0/2$. In this state, even if there is a little noise signal in the $f_0/2$ frequency signal, the signal level increases gradually and oscillation occurs in the end. This is called $f_0/2$ oscillation.

In the case of a large module not miniaturized, the distance between the lines ML1, ML2 having the inductance components L1, L2 shown in FIG. 1 can be made sufficiently large. As a result, the electromagnetic coupling between the inductance components L1, L2 forming the loop LP1 does not exist, or only a very weak electromagnetic coupling exists between them. Thus, in the case of the large module, its loop gain does not exceed "1" and therefore $f_0/2$ oscillation will not take place.

However, modules are being miniaturized as described above. Consequently, signal lines are arranged in a narrow region of the module with very high density. Thus, the electromagnetic coupling between the lines becomes stronger, which permits the loop gain to exceed "1" and makes it easier for $f_0/2$ oscillation to take place.

The power supply line ML2 for the transistor Q2 is particularly designed to have such a high impedance that it can be ignored with respect to the output matching circuit 13. To obtain a high impedance, the line ML2 needs a very long line length. A typical example of the line ML2 is a $\lambda/4$ line having a length of $\lambda/4$. Here, $\lambda$ is the wavelength of the signal of the frequency $f_0$. It is difficult to form the long line at the surface of the module in which chip components are arranged. For this reason, the module substrate is designed to have a multilayer structure and long lines are realized using a plurality of wiring layers.

On the other hand, the power supply line ML1 for the transistor Q1 also serves as a matching circuit in the circuit shown in FIG. 1. Thus, the power supply line needs to be long to some extent. Since a long line needed when especially frequency is low, in a small module, it is difficult to form the line only at the surface layer of the substrate. For this reason, the line is formed in a layer within the substrate.

As described above, in a conventional multilayer module substrate, the power supply lines ML1, ML2 for the transistors Q1, Q2 are laid complicatedly in the same layer. Therefore, the electromagnetic coupling between the lines ML1, ML2 cannot be avoided. As a result, the loop LP1 shown in FIG. 1 is formed, which causes a problem: $f_0/2$ oscillation takes place when the load fluctuates as described above.

Furthermore, there is a possibility that a loop LP2 will occur in addition to the loop LP1 shown in FIG. 1. The loop LP2 is formed by the electromagnetic coupling between the line ML3 constituting the input matching circuit 12 and the power supply line ML1 for the transistor Q1. The line constituting the input matching circuit 12 also needs to be long to some extent. Thus, these lines may also be formed in an inner layer. As a result, in this case, too, $f_0/2$ oscillation takes place.

As described above, a small module using a conventional multilayer-structure substrate has the following problem: when the transistors operate nonlinearly due to disturbance, such as a fluctuation in the load, the loop gain exceeds "1," which induces $f_0/2$ oscillation.

One patent reference related to this technique is Jpn. Pat. Appln. KOKAI Publication No. 2000-357771. In this reference, a power supply line 25 for supplying direct-current power to an active element is provided in a layer between a ground layer 39 and a ground layer 40. However, the technique disclosed in this patent reference is for preventing alternating-current noise components caused by a high-frequency circuit from entering the direct-current power supply. Accordingly, the reference has implied neither a decrease in the loop gain nor prevention of $f_0/2$ oscillation.

Accordingly, a high-frequency power amplifier module capable of preventing $f_0/2$ oscillation is demanded.

BRIEF SUMMARY OF THE INVENTION

According to an aspect of the present invention, there is provided a high-frequency power amplifier comprising: a substrate including at least a first and a second wiring layer and at least one ground layer provided between the first and second wiring layers; a first transistor which is provided at the first wiring layer and which amplifies a supplied high-frequency signal; a second transistor which is provided at the first wiring layer and which amplifies the output signal of the first transistor; a first power supply line which supplies power to the first transistor and which is provided at the first wiring layer; and a second power supply line which supplies power to the second transistor and which is provided at the second wiring layer.

According to another aspect of the present invention, there is provided a high-frequency power amplifier comprising: a substrate including at least a first, a second, and a third wiring layer and at least one ground layer provided between the second and third wiring layers; a first transistor which is provided at the first wiring layer and which amplifies a supplied high-frequency signal; a second transistor which is provided at the first wiring layer and which amplifies the output signal of the first transistor; a first power supply line which supplies power to the first transistor and which is provided at the third wiring layer; and a second power supply line which supplies power to the second transistor and which is provided at the second wiring layer.

DETAILED DESCRIPTION OF THE INVENTION

Hereinafter, referring to the accompanying drawings, embodiments of the present invention will be explained.

FIRST EMBODIMENT

FIGS. 2 to 4E show a first embodiment of the present invention.

Figure 1:
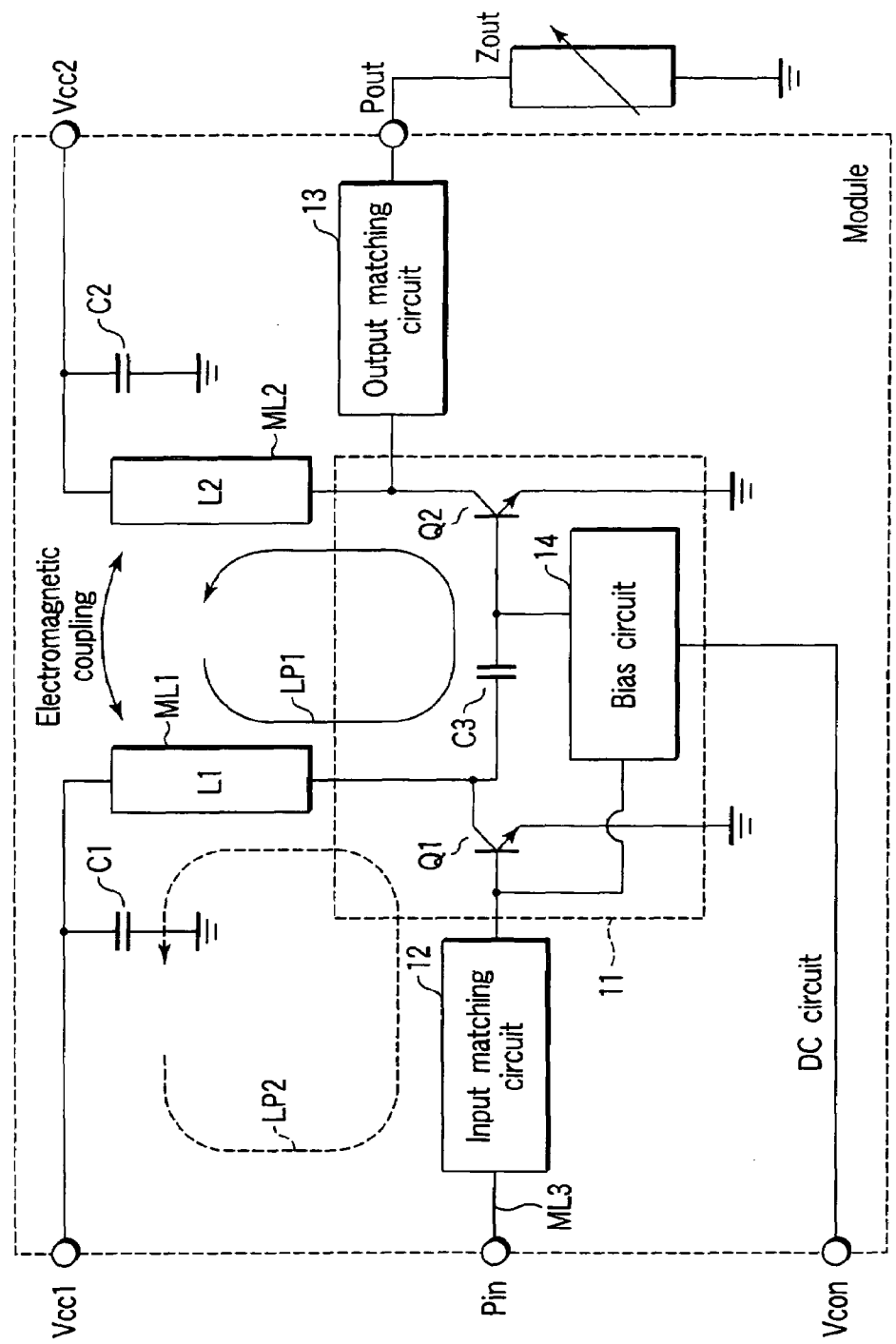
FIG. 1 is a circuit diagram showing an example of places where loops are formed in a high-frequency amplifier.

A circuit applied to the first embodiment, which is the same as the circuit of FIG. 1, is a power amplifier for a CDMA (Code Division Multiple Access) signal in, for example, a 1900-MHz band. In FIGS. 2 to 4E, the same parts as those in FIG. 1 are indicated by the same reference numerals.

Figure 2:
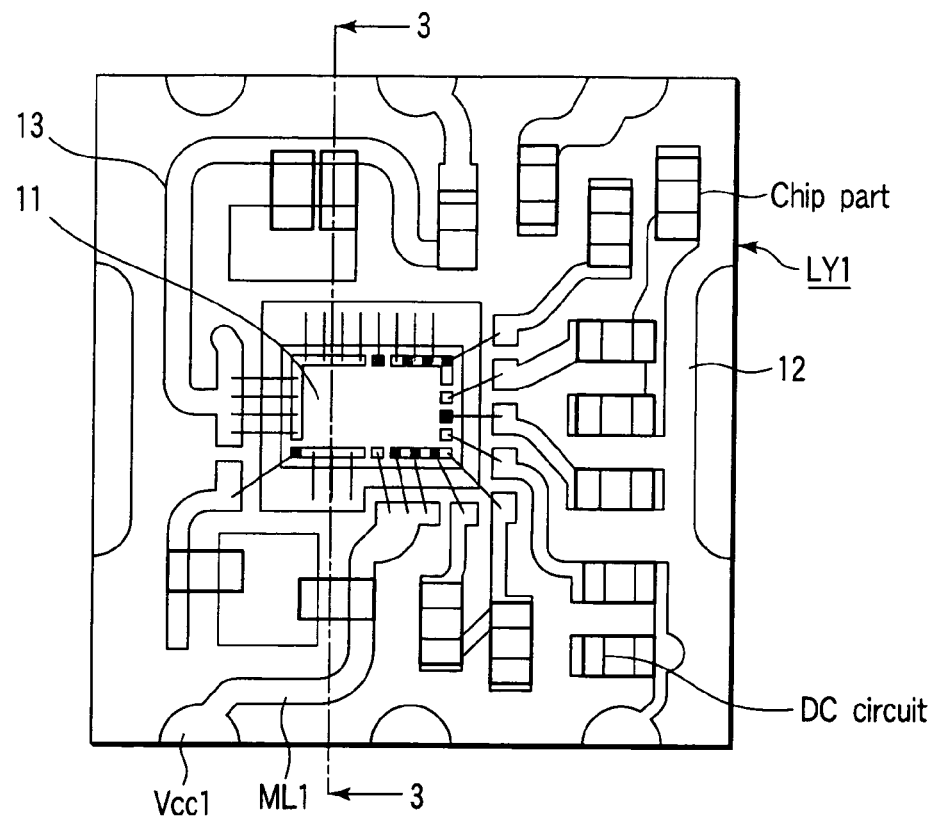
FIG. 2 is a plan view of the substrate surface of a high-frequency power amplifier module according to a first embodiment of the present invention.
Figure 3:
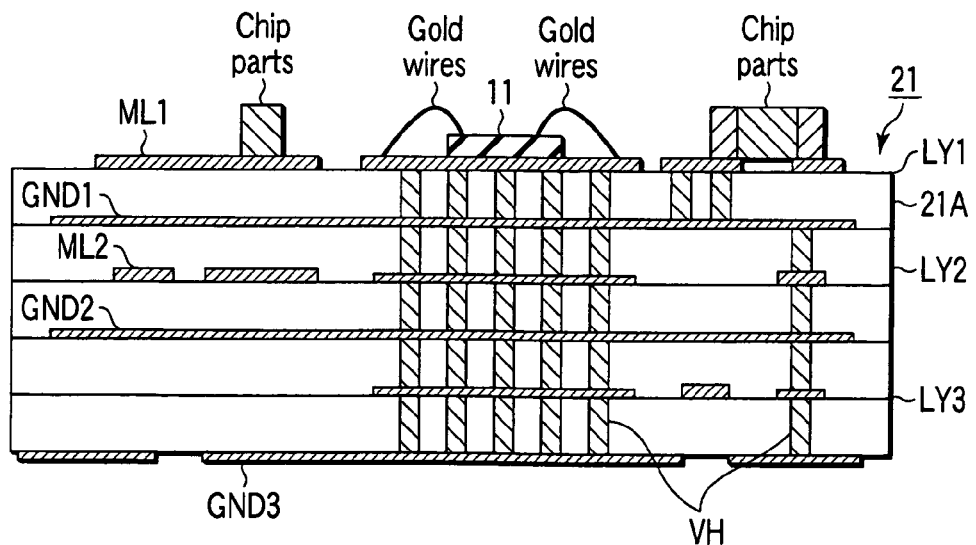
FIG. 3 is a sectional view taken along line 3—3 of FIG. 2.

In FIGS. 2 and 3, a high-frequency power amplifier module 21 includes multilayer dielectric layers and wiring layers. Specifically, the module 21 has a structure where a plurality of ceramic thin film substrates are stacked one on top of another. The main component of the thin film substrates is, for example, alumina. On the front and back of each substrate 21A, a wiring layer is formed. Specifically, a first, a second, and a third wiring layer LY1, LY2, LY3 are arranged sequentially from the top of the module 21 downward. A first ground layer GND1 is provided between the first and second wiring layers LY1, LY2. A second ground layer GND2 is provided between the second and third wiring layers LY2, LY3. A third ground layer GND3 is provided on the back of the substrate of the lowest layer. Most of the surface of each of the first, second, and third ground layers GND1, GND2, and GND3 is covered with a conducting film, such as a metal ground pattern, as shown by slanted lines in FIGS. 4A, 4C, and 4E. The wires between the substrates are connected through via-holes VH.

In the first embodiment, the length of each side of the module 21 is, for example, 5 mm. The third ground layer GND 3 and land pattern provided on the substrate of the lowest layer are connected to a board (not shown) on which the module 21 is mounted.

On the highest layer (or the first wiring layer LY1), the GaAs chip 11, input matching circuit 12, output matching circuit 13, line ML1 having the inductance component L1, wires for supplying a control signal and others to the GaAs chip (DC circuit), and various chip components, which are shown in FIG. 1, are provided. The line ML1 is connected between the power pin $V_{cc1}$ and the collector of the transistor Q1 in the GaAs chip 11. In the case of a power amplifier in a 1900-MHz band, the line length for obtaining a specific impedance may be short. Thus, the line ML1 can be formed at the first wiring layer LY1. The line ML1 is formed on a portion which is apart from the input matching circuit 12 and the output matching circuit 13. Therefore, the line ML1 does not form a loop together with the input matching circuit 12 and the output matching circuit 13. The GaAs chip 11 and the substrate wiring are connected with gold wires (bonding wires).

Figure 4A:
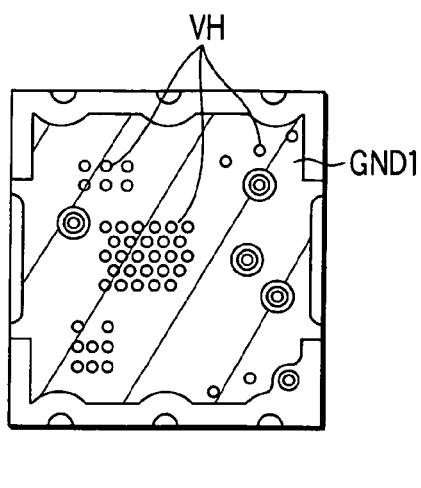
FIGS. 4A to 4E are plan views showing the individual layers of FIG. 3.
Figure 4B:
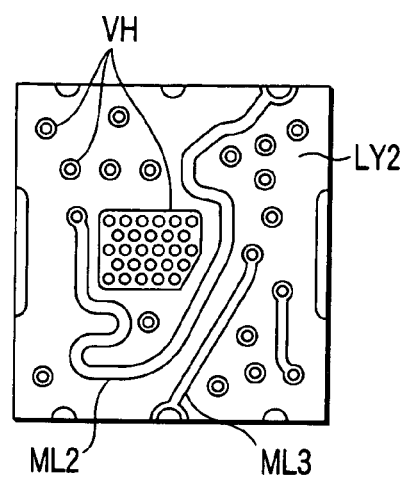

On the other hand, the line ML2 for supplying current to the transistor Q2 is provided at the second wiring layer LY2 lower than the first wiring layer as shown in FIGS. 3 and 4B. The second wiring layer LY2 has a via-hole area for connecting the wiring of the first wiring layer LY1 to the lower wiring. Most of the area excluding the via-hole area is occupied by the line ML2 for supplying power to the transistor Q2. That is, the second wiring layer LY2 is capable of forming a long line necessary to realize a high impedance.

Figure 4C:
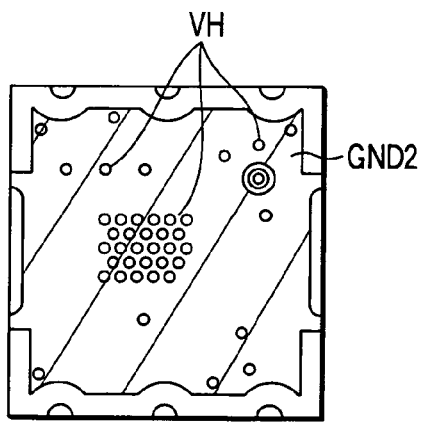
Figure 4D:
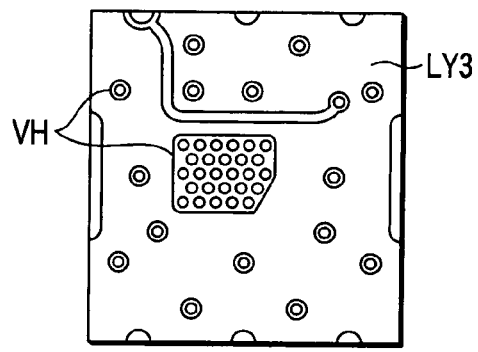
Figure 4E:
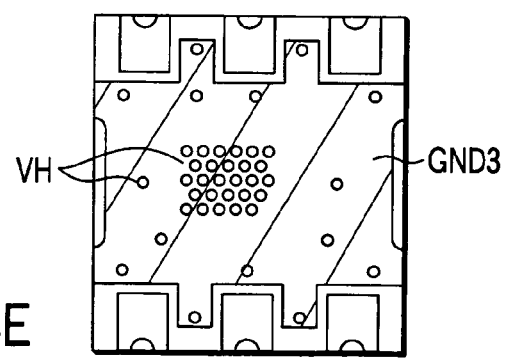

Furthermore, a line running to the land pattern is mainly formed at the third wiring layer LY3 below the second wiring layer LY2. Between the first wiring layer LY1 and the second wiring layer LY2, the first ground layer GND1 is provided as shown in FIG. 4A. In addition, between the second wiring layer LY2 and the third wiring layer LY3, the second ground layer GND2 is provided as shown in FIG. 4C.

With the above configuration, the power supply line ML1 for the transistor Q1 is separated completely from the power supply line ML2 for the transistor Q2 by the first ground layer GND1 provided between them. As a result, there is no electromagnetic coupling between the line ML1 and the line ML2. Consequently, the lines ML1, ML2, and the transistor Q2 do not form a loop LP1. Thus, it is possible to suppress $f_0/2$ oscillation.

In the above explanation, the nonlinear operation of the transistor Q2 has been described. The transistor Q1 can also operate nonlinearly due to a fluctuation in the impedance as the transistor Q2 does. In this case, a loop LP2 is formed by the power supply line ML1 for the transistor Q1, the input signal line ML3, and the input matching circuit 12 as shown by a broken line in FIG. 1. Even in such a case, the input signal line ML3 is formed at the second wiring layer LY2 lower than the line ML1 and the ground layer GND1 is provided between the lines ML1, ML3 as shown in FIG. 4B in the first embodiment. This makes it possible to suppress the electromagnetic coupling between the power supply line ML1 for the transistor Q1 and the input signal line ML3. As a result, the formation of the loop LP2 on the input terminal side can be prevented. Accordingly, even when the transistor Q1 falls into a nonlinear operating state due to not only a fluctuation in the impedance at the output terminal but also a fluctuation in the impedance at the input terminal, $f_0/2$ oscillation can be suppressed.

SECOND EMBODIMENT

Figure 5:
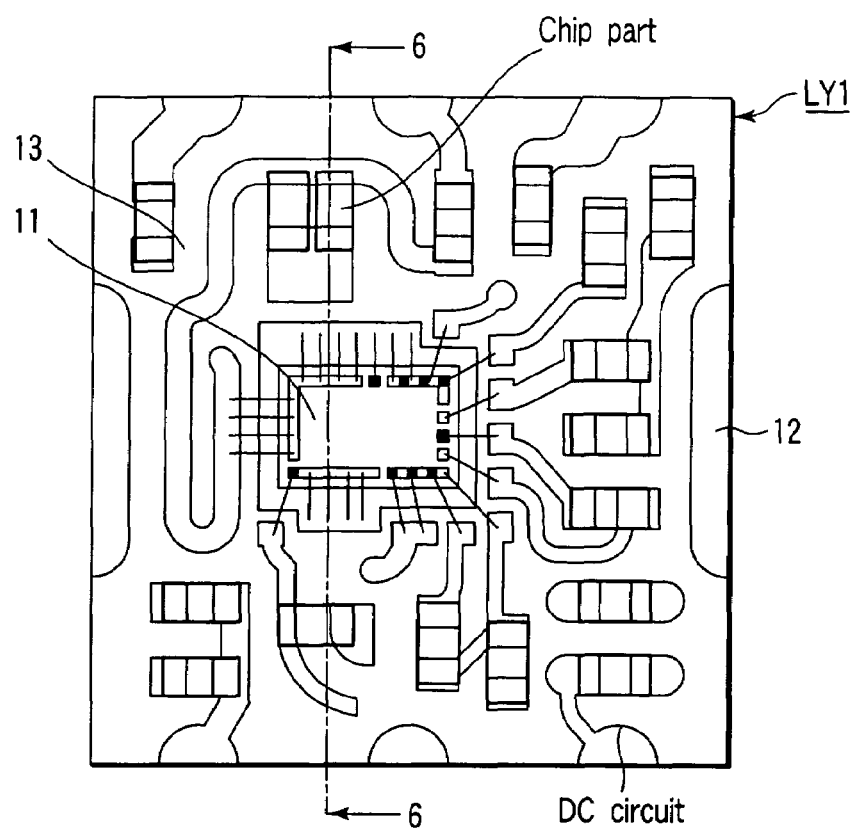
FIG. 5 is a plan view of a first wiring layer of a high-frequency power amplifier module according to a second embodiment of the present invention.
Figure 6:
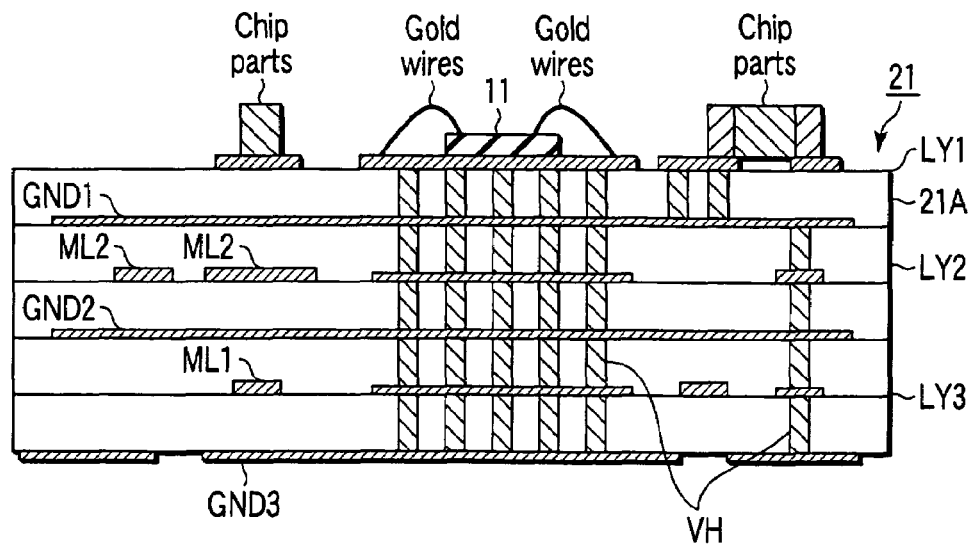
FIG. 6 is a sectional view taken along line 6—6 of FIG. 5.

FIG. 5 to FIG. 6E show a second embodiment of the present invention. The second embodiment is applied to a power amplifier for CDMA signals in, for example, a 900-MHz band lower than the frequency band in the first embodiment. The main configuration of the second embodiment is the same as that of the first embodiment, except that the frequency is equal to or less than half of the frequency in the first embodiment. For this reason, to realize the same impedance as that of the first embodiment, the line length must be made longer than that in the first embodiment. Thus, the power supply line ML1 for the transistor Q1 cannot be formed by using only the top layer region serving as the first wiring layer LY1 as in the first embodiment.

Figure 7A:
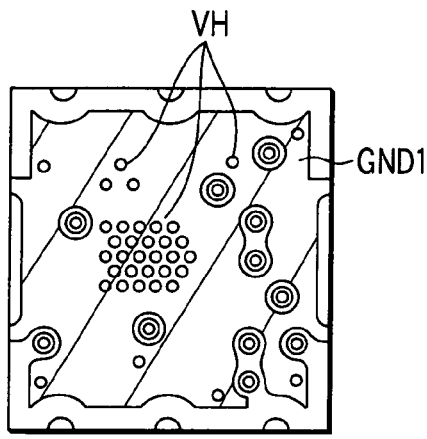
FIGS. 7A to 7E are plan views showing the individual layers of FIG. 6.
Figure 7B:
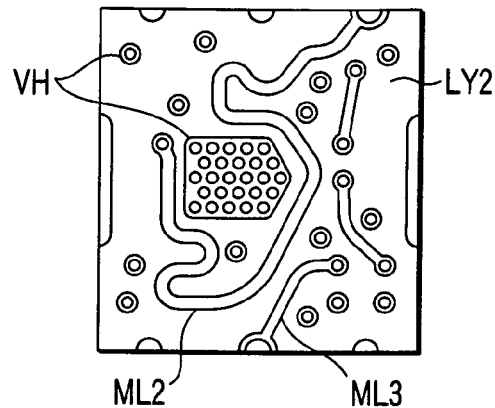
Figure 7C:
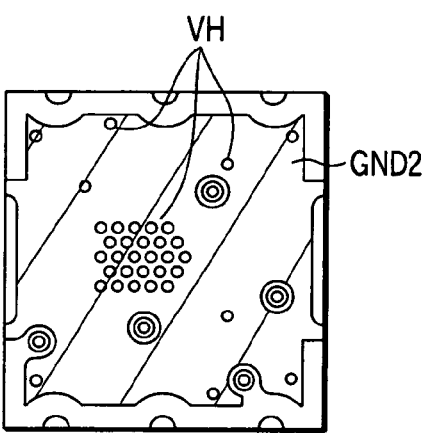
Figure 7D:
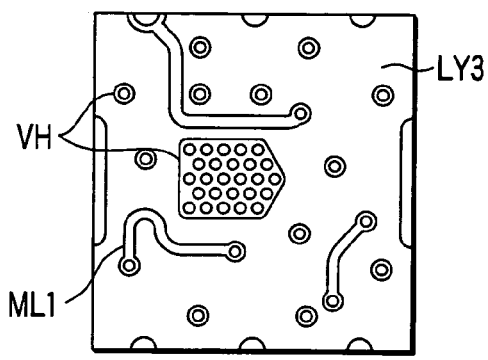
Figure 7E:
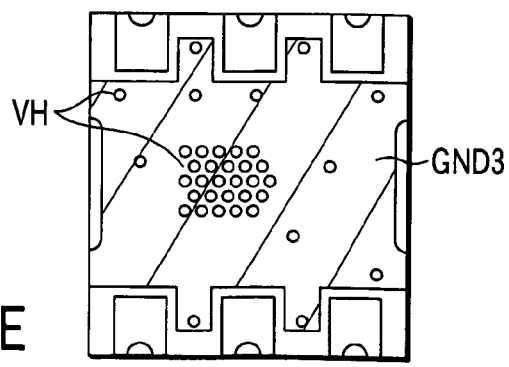

To avoid this problem, the power supply line ML1 for the transistor Q1 is formed at the third wiring layer LY3 as shown in FIG. 6 and FIG. 7D. The power supply line ML2 for the transistor Q2 is formed at the second wiring layer LY2 as shown in FIG. 7B. A second ground layer GND 2 is formed between the power supply line ML1 for the transistor Q1 and the power supply line ML2 for the transistor Q2. Thus, the second ground layer GND2 disconnects the power supply line ML1 from the power supply line ML2, with the result that there is no electromagnetic coupling between the lines ML1 and ML2. As a result, no loop including the lines ML1 and ML2 is formed, which suppresses $f_0/2$ oscillation.

Furthermore, with the second embodiment, it is possible to avoid the electromagnetic coupling between the output matching circuit 13 and the power supply line ML1 for the transistor Q1. The electromagnetic coupling can contribute to another loop. Specifically, the output matching circuit 13 is formed at the first wiring layer LY1 shown in FIG. 5 and FIG. 6. In contrast, the power supply line ML1 for the transistor Q1 is formed at the third wiring layer LY3 shown in FIG. 6 and FIG. 7D. Between the first wiring layer LY1 and the third wiring layer LY3, the first ground layer GND1 and the second ground layer GND2 are formed. This makes it possible to avoid the electromagnetic coupling between the output matching circuit 13 and the power supply line ML1 for the transistor Q1. As a result, it is possible to prevent the formation of a loop including the output matching circuit 13 and the power supply line ML1 for the transistor Q1. Thus, $f_0/2$ oscillation can be suppressed.

When the impedance at the output terminal of the module was varied greatly at the time of the maximum rated output (or 28-dBm output) in a conventional structure where the power supply lines were formed on the same wiring layer, $f_0/2$ oscillation was observed. In contrast, under the same conditions as in the conventional structure, $f_0/2$ oscillation could not be observed in the first and second embodiments. Specifically, in the conventional structure, when the impedance at the output terminal was so varied that VSWR=5:1 was exceeded, $f_0/2$ oscillation was observed. In the first and second embodiments, however, even when VSWR was varied to VSWR=7:1, the oscillation was not observed.

This invention is not limited to the first and second embodiments. For instance, one ground layer has been formed between the power supply line ML1 and the power supply line ML2. However, two or more ground layers may be formed between the power supply line ML1 and the power supply line ML2.

Of course, the present invention may be practiced or embodied in still other ways without departing from the spirit or essential character thereof.

As described above, in a case where modules are miniaturized, this invention can suppress $f_0/2$ oscillation even if the transistors operate nonlinearly due to disturbance, and therefore is effective in the technical field of high-frequency power amplifier modules.

What is claimed is:
1. A high-frequency power amplifier comprising:
   a substrate including at least a first and a second wiring layer and at least one ground layer provided between the first and second wiring layers;
   a first transistor which is provided at the first wiring layer and which amplifies a supplied high-frequency signal;
   a second transistor which is provided at the first wiring layer and which amplifies the output signal of the first transistor;
   a first power supply line which supplies power to the first transistor and which is provided at the first wiring layer; and
   a second power supply line which supplies power to the second transistor and which is provided at the second wiring layer.

2. The high-frequency power amplifier according to claim 1, wherein most of the surface of said at least one ground layer is covered with a conducting film.

3. The high-frequency power amplifier according to claim 1, further comprising a signal line which directs the high-frequency signal to the first transistor and which is formed at the second wiring layer.

4. The high-frequency power amplifier according to claim 3, further comprising an input matching circuit which is connected between the signal line and the first transistor, the input matching circuit being formed on the first wiring layer and apart from the first power supply line.

5. The high-frequency power amplifier according to claim 1, further comprising an output matching circuit which is connected to the output terminal of the second transistor, the output matching circuit being formed on the first wiring layer and apart from the first power supply line.

6. A high-frequency power amplifier comprising:
   a substrate including at least a first, a second, and a third wiring layer and a first ground layer provided between the second and third wiring layers;
   a first transistor which is provided at the first wiring layer and which amplifies a supplied high-frequency signal;
   a second transistor which is provided at the first wiring layer and which amplifies the output signal of the first transistor;
   a first power supply line which supplies power to the first transistor and which is provided at the third wiring layer; and
   a second power supply line which supplies power to the second transistor and which is provided at the second wiring layer.

7. The high-frequency power amplifier according to claim 6, wherein most of the surface of said first ground layer is covered with a conducting film.

8. The high-frequency power amplifier according to claim 6, further comprises a signal line which directs the high-frequency signal to the first transistor and which is formed at the second wiring layer.

9. The high-frequency power amplifier according to claim 6, further comprising:
   an input matching circuit which is connected between the first transmitter and a signal line directing the high-frequency signal to the first transistor and which is formed at the first wiring layer; and
   a second ground layer provided between the first wiring layer and the second wiring layer.

10. The high-frequency power amplifier according to claim 6, further comprising:
    an output matching circuit which is connected to the output terminal of the second transistor and which is formed at the first wiring layer; and
    the second ground layer which is disposed between the first wiring layer and the second wiring layer.

11. A high-frequency power amplifier comprising:
    a substrate including a first and a second wiring layer and a first ground layer provided between the first and second wiring layers;
    a first transistor which is provided at the first wiring layer and which amplifies a supplied high-frequency signal;
    a second transistor which is provided at the first wiring layer and which amplifies the output signal of the first transistor;
    a first power supply line which supplies power to the first transistor and which is provided at the first wiring layer; and
    a second power supply line which supplies power to the second transistor and which is provided at the second wiring layer.

12. The high-frequency power amplifier according to claim 11, wherein most of the surface of the first ground layer is covered with a conducting film.

13. The high-frequency power amplifier according to claim 11, further comprising a signal line which directs a high-frequency signal to the first transistor and which is formed at the second wiring layer.

14. The high-frequency power amplifier according to claim 13, further comprising an input matching circuit which is connected between the signal line and the first transistor, the input matching circuit being formed at the first wiring layer and apart from the first power supply line.

15. The high-frequency power amplifier according to claim 11, further comprising an output matching circuit which is connected to the output terminal of the second transistor, the output matching circuit being formed at the first wiring layer and apart from the first power supply line.

16. A high-frequency power amplifier comprising:
    a substrate including a first, a second, and a third wiring layer and a first and a second ground layer, the first ground layer being provided between the first and second wiring layers and the second ground layer being provided between the second and third wiring layers;
    a first transistor which is provided at the first wiring layer and which amplifies a supplied high-frequency signal;
    a second transistor which is provided at the first wiring layer and which amplifies the output signal of the first transistor;
    a first power supply line which supplies power to the first transistor and which is provided at the third wiring layer; and
    a second power supply line which supplies power to the second transistor and which is provided at the second wiring layer.

17. The high-frequency power amplifier according to claim 16, wherein most of the surfaces of the first and second ground layers are covered with a conducting film.

18. The high-frequency power amplifier according to claim 16, further comprises a signal line which directs a high-frequency signal to the first transistor and which is formed at the second wiring layer.

19. The high-frequency power amplifier according to claim 16, further comprising an input matching circuit which is connected between the first transmitter and a signal line directing the high-frequency signal to the first transistor and which is formed at the first wiring layer.

20. The high-frequency power amplifier according to claim 16, further comprising an output matching circuit which is connected to the output terminal of the second transistor and which is formed at the first wiring layer.

* * * * *